US009578431B2

(12) United States Patent
Kim et al.

(10) Patent No.: US 9,578,431 B2
(45) Date of Patent: Feb. 21, 2017

(54) AUDIO OUTPUT APPARATUS CAPABLE OF CONTROLLING TEMPERATURE OF VOICE COIL AND METHOD THEREOF

(71) Applicant: SAMSUNG ELECTRONICS CO., LTD., Suwon-si (KR)

(72) Inventors: Oan-jin Kim, Suwon-si (KR); Jong-woo Kim, Yongin-si (KR); Kee-yeong Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 217 days.

(21) Appl. No.: 14/266,204

(22) Filed: Apr. 30, 2014

(65) Prior Publication Data

US 2014/0321656 A1 Oct. 30, 2014

Related U.S. Application Data

(60) Provisional application No. 61/817,521, filed on Apr. 30, 2013.

(30) Foreign Application Priority Data

Mar. 20, 2014 (KR) ........................ 10-2014-0032422

(51) Int. Cl.
*H03G 11/00* (2006.01)
*H04R 29/00* (2006.01)
*H04R 3/00* (2006.01)

(52) U.S. Cl.
CPC .............. *H04R 29/00* (2013.01); *H04R 3/007* (2013.01); *H04R 29/003* (2013.01)

(58) Field of Classification Search
None
See application file for complete search history.

(56) References Cited

U.S. PATENT DOCUMENTS

| | | | |
|---|---|---|---|
| 7,447,318 B2 | 11/2008 | Button et al. | |
| 2011/0194705 A1 * | 8/2011 | Gautama .................. | H03F 1/30 381/59 |
| 2013/0077794 A1 | 3/2013 | Risbo et al. | |

(Continued)

FOREIGN PATENT DOCUMENTS

| | | |
|---|---|---|
| EP | 1 799 013 A1 | 6/2007 |
| JP | 2006-287847 A | 10/2006 |

(Continued)

OTHER PUBLICATIONS

Communication dated Oct. 6, 2014 issued by the European Patent Office in counterpart European Application No. 14166747.7.

(Continued)

*Primary Examiner* — Joseph Saunders, Jr.
*Assistant Examiner* — James Mooney
(74) *Attorney, Agent, or Firm* — Sughrue Mion, PLLC

(57) ABSTRACT

An audio output apparatus and a method are provided, which includes calculating a temperature value of a voice coil of the audio output apparatus using a heat transfer model algorithm, in response to power being supplied to the voice coil; adjusting an output level of an audio signal by determining a gain value to adjust the output level of the audio signal according to the calculated voice coil temperature value, and outputting the audio signal with the adjusted output level.

18 Claims, 11 Drawing Sheets

(56) References Cited

U.S. PATENT DOCUMENTS

| | | | | |
|---|---|---|---|---|
| 2013/0077796 | A1 | 3/2013 | Risbo et al. | |
| 2013/0083928 | A1* | 4/2013 | Williams | H03G 7/007 381/55 |
| 2014/0126730 | A1* | 5/2014 | Crawley | H04R 29/001 381/59 |

FOREIGN PATENT DOCUMENTS

| | | | |
|---|---|---|---|
| JP | 2006-304053 | A | 11/2006 |
| JP | 2007-174384 | A | 7/2007 |
| JP | 2011-4210 | A | 1/2011 |
| WO | 02/21879 | A2 | 3/2002 |

OTHER PUBLICATIONS

Douglas J. Button "Heat Dissipation and Power Compression in Loudspeakers", Journal of the Audio Engineering Society, vol. 40, No. 1/02, Jan. 1, 1992, 10 pgs. total.

Klippel, Wolfgang, et al., "Nonlinear Modeling of the Heat Transfer in Loudspeakers," Submitted Manuscript 12, Klippel GmbH, pp. 1-44, Mar. 2003.

* cited by examiner (a) (b)

AUDIO OUTPUT APPARATUS CAPABLE OF CONTROLLING TEMPERATURE OF VOICE COIL AND METHOD THEREOF

CROSS-REFERENCE TO RELATED APPLICATIONS

This application claims priority from U.S. Provisional Application No. 61/817,521, filed on Apr. 30, 2013 in the U.S. Patent and Trademark Office and Korean Patent Application No. 10-2014-0032422, filed on Mar. 20, 2014 in the Korean Patent and Trademark Office, the disclosures of which are incorporated herein by reference in its entirety.

BACKGROUND

1. Field

Apparatuses and methods consistent with exemplary embodiments relate to outputting audio, and more particularly, to an audio output apparatus capable of controlling a temperature of a voice coil, and a method thereof.

2. Description of the Related Art

Power may be supplied to an audio output apparatus such as a speaker at a level corresponding to that of an output level of the speaker. An increase in power corresponds to an increase in the output level of an audio signal. Electric current is introduced to a voice coil wound around a vibrating plate that transmits vibration to the atmosphere, and a temperature of the voice coil increases with the introduction of electric current. Accordingly, when an audio signal is output at high output level for a long period of time, the temperature of the voice coil increases to a melting point of a coating layer on the voice coil, causing problems such as damage to the voice coil.

To address the problem mentioned above, related audio output apparatus divides a digitized audio signal according to respective frequency bands, and estimate sizes of the output signals of the audio signals of the respective frequency bands that will be output through an amplifier. The audio output apparatus then estimates a temperature of the voice coil by applying the sizes of the output signals of the audio signals, to a pre-defined heating model algorithm. The audio output apparatus then controls the temperature rise of the voice coil by either decreasing or increasing the gains to adjust the output levels of the audio signal, depending on whether the estimated temperature of the voice coil exceeds a preset threshold or not.

However, because the voice coils generally have low heat capacity, the temperature of the voice coils rapidly decreases from high temperatures to an ambient temperature when an audio signal is not input. The heat capacity of the permanent magnet provided to generate vibration in response to electric current flowing on voice coil is about 200 times greater than that of the voice coil. Accordingly, the permanent magnet requires a longer time than the voice coil to increase or decrease in temperature.

However, there exists a generated error between the estimated temperature of the voice coil according to the method explained above and the actual temperature of the voice coil in a case when power is supplied to the audio output apparatus to drive it again in a state where the voice coil has a higher temperature than a room temperature. This error delays a control timing of gains and an adjustment of an audio signal output level, thus creating a risk of overheating of the voice coil.

SUMMARY

Exemplary embodiments of the present inventive concept overcome the above disadvantages and other disadvantages not described above. Also, the present inventive concept is not required to overcome the disadvantages described above, and an exemplary embodiment of the present inventive concept may not overcome any of the problems described above.

Exemplary embodiments address the problems as described above and protect a voice coil of an audio output apparatus from overheating.

Exemplary embodiments may maintain a predetermined sound quality by controlling the gains according to temperature variations of the voice coil.

According to an aspect of an exemplary embodiment, there is provided a method of an audio output apparatus for outputting an audio, the method including: calculating a temperature value of a voice coil of an audio output apparatus using a preset heat transfer model algorithm, in response to power being supplied to the voice coil, adjusting an output level of an audio signal by determining a gain value to adjust the output level of the audio signal based on the calculated voice coil temperature value, and outputting the audio signal with the adjusted output level.

The method may additionally include setting an initial voice coil temperature value using the heat transfer model algorithm. The adjusting may include determining the gain value depending on whether or not the voice coil temperature value, previously calculated based on the set initial voice coil temperature value, is within a preset threshold interval.

The initial voice coil temperature value is a temperature value of the voice coil at a time point of power being re-supplied to the voice coil of the audio output apparatus after a cut off of an initial power supply.

The heat transfer model algorithm may be expressed by:

$$T(s)/P(s)=(R_{TV}R_{TM}(C_{TV}+C_{TM})s+(R_{TV}+R_{TM}))/((R_{TV}R_{TM}C_{TV}C_{TM})s^2+(R_{TV}C_{TV}+R_{TM}C_{TM})s+1)$$

where P(s) denotes output power relative to the audio signal, T(s) is voice coil temperature value, $R_{TV}$ is heat resistance of the voice coil, $C_{TV}$ is heat capacity of the voice coil, $R_{TM}$ is heat resistance of a permanent magnet, and $C_{TM}$ is heat capacity of a permanent magnet.

The adjusting may include determining whether or not the voice coil temperature value is in a preset first threshold interval, and in response to a result of the determining indicating that the voice coil temperature value exceeds the first threshold interval, determining the gain value to adjust the output level of the audio signal based on a first gain value that is lower than a preset reference gain value.

The determining may include, in response to the voice coil temperature value being in a preset heat resistant limit interval, determining the gain value to adjust the output level of the audio signal based on a second gain value that is lower than the first gain value.

The heat resistant limit interval may be a temperature interval exceeding a melting point of the voice coil, and the second gain value is a result of decreasing in proportion to a difference between the voice coil temperature value and a highest temperature value of the first threshold interval.

The calculating may include measuring temperature of the voice coil continuously at a predetermined interval, and the adjusting may additionally include determining whether or not the voice coil temperature value is below a preset second threshold interval, in a state that the audio signal is output at an output level adjusted based on the first or second gain value; and in response to a result of the determining indicating that the voice coil temperature value is between the first and second threshold intervals, maintaining the first or second gain value, or in response to the result of the determining indicating that the voice coil temperature value is below the second threshold interval, determining the gain value to adjust the output level of the audio signal based on a third gain value that is higher than the first gain value.

The third gain value may be within a narrower interval than that of the first gain value.

According to an aspect of another exemplary embodiment, there is provided an audio output apparatus including: an input configured to receive an audio signal, a signal processor configured to process the audio signal, an output configured to output the processed audio signal, a controller configured to calculate a temperature value of a voice coil using a preset heat transfer model algorithm, in response to power being supplied to the voice coil, and determine a gain value to adjust an output level of the audio signal based on the calculated voice coil temperature value, and adjust the output level of the processed audio signal.

The controller may set an initial temperature value of the voice coil using the heat transfer model algorithm, and determine the gain value depending on whether or not the voice coil temperature value previously calculated based on the set initial voice coil temperature value is within a preset threshold interval.

The initial temperature value may be a temperature value of the voice coil at a time point of power being re-supplied to the voice coil of the audio output apparatus after a cut off of an initial power supply.

The heat transfer model algorithm may be expressed by:

$$T(s)/P(s)=(R_{TV}R_{TM}(C_{TV}+C_{TM})s+(R_{TV}+R_{TM}))/((R_{TV}R_{TM}C_{TV}C_{TM})s^2+(R_{TV}C_{TV}+R_{TM}C_{TM})s+1)$$

where P(s) denotes output power relative to the audio signal, T(s) is voice coil temperature value, $R_{TV}$ is heat resistance of the voice coil, $C_{TV}$ is heat capacity of the voice coil, $R_{TM}$ is heat resistance of a permanent magnet, and $C_{TM}$ is heat capacity of a permanent magnet.

When the voice coil temperature value exceeds the first threshold interval, the controller determines the gain value to adjust the output level of the audio signal based on a first gain value that may be lower than a preset reference gain value.

When the voice coil temperature value is in a preset heat resistant limit interval, the controller may determine the gain value to adjust the output level of the audio signal based on a second gain value that is lower than the first gain value.

The heat resistant limit interval may be a temperature interval exceeding a melting point of the voice coil, and the second gain value may be a result of decreasing in proportion to a difference between the voice coil temperature value and a highest temperature value of the first threshold interval.

The controller may determine whether or not the voice coil temperature value is below a preset second threshold interval, in a state that the audio signal is output at an output level adjusted based on the first or second gain value, and maintain the first or second gain value in response to the voice coil temperature value being between the first and second threshold intervals, or determine the gain value to adjust the output level of the audio signal based on a third gain value that is higher than the first gain value in response to a result of the determining indicating that the voice coil temperature value is below the second threshold interval.

The third gain value may be within a narrower interval than that of the first gain value.

According to an aspect of another exemplary embodiment, there is provided a method for outputting audio, the method including: calculating a temperature value of the voice coil of an audio output apparatus based on a previously calculated voice coil temperature value in response to power being re-supplied to the voice coil; adjusting an audio signal by using a gain value determined from the calculated voice coil temperature value; and outputting the adjusted audio signal.

The method may further include setting an initial voice coil temperature value using the heat transfer model algorithm. The adjusting may include determining the gain value depending on whether the previously calculated voice coil temperature value is within a preset threshold interval.

The calculating may be performed based on a heat transfer model algorithm expressed by: $T(s)/P(s)=(R_{TV}R_{TM}(C_{TV}+C_{TM})s+(R_{TV}+R_{TM}))/((R_{TV}R_{TM}C_{TV}C_{TM})s^2+(R_{TV}C_{TV}+R_{TM}C_{TM})s+1)$, where P(s) denotes output power relative to the audio signal, T(s) is voice coil temperature value, $R_{TV}$ is heat resistance of the voice coil, $C_{TV}$ is heat capacity of the voice coil, $R_{TM}$ is heat resistance of a permanent magnet, and $C_{TM}$ is heat capacity of a permanent magnet.

BRIEF DESCRIPTION OF THE DRAWINGS

The above and/or other aspects will be more apparent by describing certain exemplary embodiments with reference to the accompanying drawings, in which.

DETAILED DESCRIPTION OF EXEMPLARY EMBODIMENTS

Figure 1:
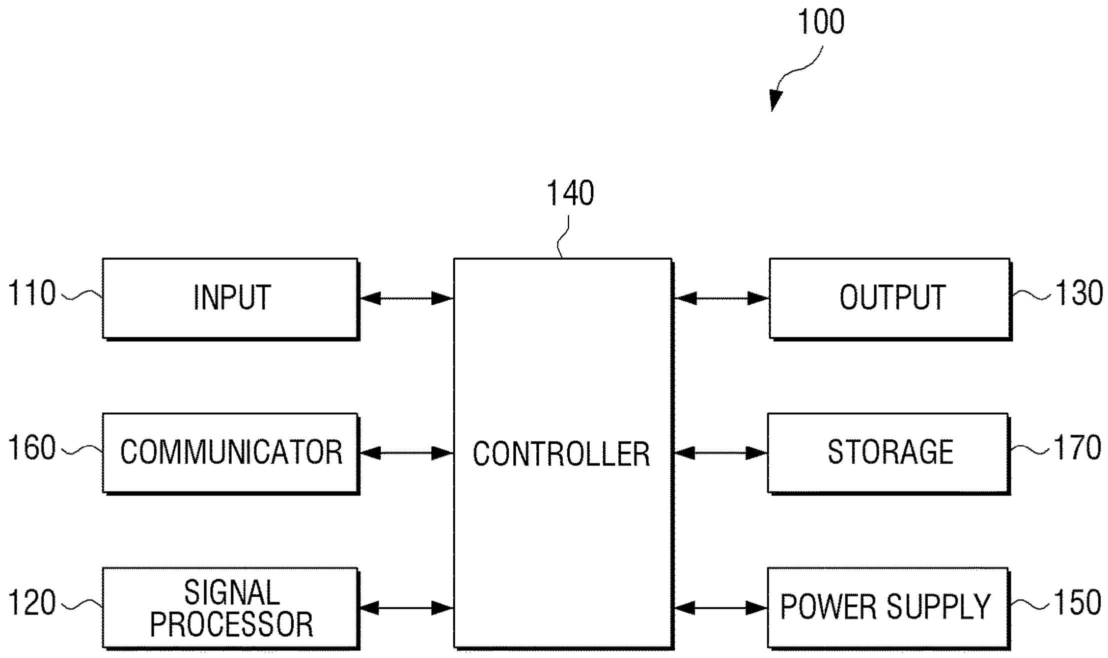
FIG. 1 is a block diagram of an audio output apparatus according to an exemplary embodiment.

Certain exemplary embodiments of the present inventive concept will now be described in greater detail with reference to the accompanying drawings.

In the following description, same drawing reference numerals are used for the same elements even in different drawings. The matters defined in the description, such as detailed construction and elements, are provided to assist in a comprehensive understanding of the present inventive concept. Accordingly, it is apparent that the exemplary embodiments of the present inventive concept can be carried out without those specifically defined matters. Also, well-known functions or constructions are not described in detail since they would obscure the exemplary embodiments with unnecessary detail.

FIG. 1 is a block diagram of an audio output apparatus according to an exemplary embodiment.

Referring to FIG. 1, an audio output apparatus 100 is a terminal such as a speaker which outputs an audio signal. The audio output apparatus 100 may include an input 110, a signal processor 120, an output 130, a controller 140, a power supply 150, a communicator 160 and a storage 170.

The input 110 receives an audio signal from an audio source apparatus (not illustrated) and the signal processor 120 processes an audio signal output through the input 110 into a form that can be output through the output 130. To be specific, an audio signal output through the input 110 may be an analog signal. In this case, the signal processor 120 converts the analog audio signal into a digital signal and separates the digitized audio signal according to frequency bands. The signal processor 120 then converts the audio signals of the respective frequency bands into analog audio signals. Accordingly, the output 130 amplifies the analog audio signal and provides audible signals.

Processing the incoming audio signal and amplifying and outputting the processed audio signals will not be explained herein in unnecessary detail.

The controller 140 controls the overall operations of the constituents of the audio output apparatus 100. In response to a supply of external power through the power supply 150, the controller 140 calculates temperature value of the voice coil, using a preset heat transfer model algorithm. The voice coil may be a wound coil which is directly connected to a vibrating plate, and which plays a role of vibrating the vibrating plate with the magnetic field from the electric current flowing through the voice coil and the vibration generated from the permanent magnet. Accordingly, as the air vibrates in response to the vibration of the vibrating plate, sound is output in response to the audio signal. The temperature of the coil can increase due to electric current flowing in the voice coil.

Accordingly, when external power is supplied, the controller 140 may estimate a current temperature of the voice coil by periodically calculating the temperature value of the voice coil using the heat transfer model algorithm. With the temperature value of the voice coil being calculated, the controller 140 determines according to the calculated temperature value of the voice coil the gain value to adjust the output level of the audio signal to be output through the output 130 and adjusts the output level of the processed audio signal based on the gain value.

To be more specific, when initial power is supplied to the audio output apparatus 100 via the power supply 150, the controller 140 sets initial temperature value of the voice coil using the heat transfer model algorithm. The controller 140 may then determine the gain value to adjust the output level of the audio signal, depending on whether or not the pre-calculated temperature value of the voice coil is in a preset threshold range with reference to the initial temperature value.

The initial temperature value may be a temperature measured from the voice coil when power is re-supplied through the power supply 150 after power supply cut off of the initial power supply to the audio output apparatus 100 via the power supply 150.

The heat transfer model algorithm may be used to calculate temperature value of the voice coil based on the power supplied to the audio output apparatus 100. The heat transfer model algorithm may be expressed by continuous-time transfer function of the relationship between electric energy of the power supplied to the audio output apparatus 100 and voice coil temperature:

$$T(s)/P(s)=(R_{TV}R_{TM}(C_{TV}+C_{TM})s+(R_{TV}+R_{TM}))/((R_{TV}R_{TM}C_{TV}C_{TM})s^2+(R_{TV}C_{TV}+R_{TM}C_{TM})s+1)$$ [Mathematical Expression 1]

where P(s) denotes output power relative to audio signal, T(s) is temperature value generated by the electric current introduced to voice coil according to supplied power, $R_{TV}$ is heat resistance of voice coil, $C_{TV}$ is heat capacity of voice coil, $R_{TM}$ is heat resistance of permanent magnet, and $C_{TM}$ is heat capacity of permanent magnet. However, an exemplary embodiment is not limited to any of the specific examples given above. Accordingly, it is possible to calculate temperature value of the voice coil using another heat transfer model algorithm that is known.

Referring to Mathematical Expression 1, the initial values for the heat resistance ($R_{TV}$) and heat capacity ($C_{TV}$) of the voice coil and the heat resistance ($R_{TM}$) and heat capacity ($C_{TM}$) of the permanent magnet can be set based on the room temperature (i.e., ambient temperature). That is, the temperature of the voice coil before the first power supply to the audio output apparatus 100 may be equal to the room temperature, and the initial values for the heat resistance ($R_{TV}$) and heat capacity ($C_{TV}$) of the voice coil and the heat resistance ($R_{TM}$) and heat capacity ($C_{TM}$) of the permanent magnet may be so set that the temperature value of the voice coil is calculated to be equal to the room temperature.

After the first power supply, the controller 140 calculates an output power (P(s)) for the output of audio signal in accordance with the power supply. With the output power (P(s)) calculated, the controller 140 may calculate the temperature (T(s)) of the voice coil per time, by applying preset values for the heat resistance ($R_{TV}$) and heat capacity ($C_{TV}$) of the voice coil and the heat resistance ($R_{TM}$) and heat capacity ($C_{TM}$) of the permanent magnet to Mathematical Formula 1.

That is, as the voice coil is heated due to the incoming electric current, the temperature thereof can rise for a predetermined period of time, after which the heat release rate of the voice coil and the emission rate to outside become constant. Accordingly, the voice coil is maintained at a constant temperature. When power supplied to the audio output apparatus 100 is cut off in a state that the temperature of the voice coil keeps climbing or remains constant, the temperature of the voice coil gradually decreases according to the time duration of the power supply cut off.

Accordingly, when the power from the power supply 150 is cut off in a state that the temperature (T(s)) of the voice coil per time is calculated, based on the heat transfer model algorithm expressed by Mathematic Expression 1, the temperature of the voice coil is estimated and calculated. The temperature of the voice coil calculated at the time of power re-supply is set to be the initial temperature value of the voice coil.

In order to estimate the temperature of the voice coil, the controller 140 may transform Mathematical Expression 1 involved the heat transfer model algorithm into discrete-time transfer function-involved heat transfer model algorithm, and set initial temperature of the voice coil by calculating temperature value of the voice coil estimated based on the transformed discrete-time transfer function-involved heat transfer model.

The discrete-time transfer function may be implemented as a secondary IIR filter. Generally, although cases can vary depending on the structures, the IIR filter includes two or four delay memories. Accordingly, when the initial value of the delay memory is 0, the temperature of the voice coil can be same as the room temperature. However, as explained above, when the power supply is cut off in a state that the temperature of the voice coil is at a high temperature, the temperature of the voice coil in the second threshold interval may be at a high temperature when the power is re-supplied. Accordingly, it is highly likely that there is a wide gap between the estimated temperature of the voice coil at the time of power re-supply and the actual voice coil temperature.

Accordingly, when power is re-supplied through the power supply 150, the controller 140 may calculate the temperature value of the voice coil at the time point of power re-supply using the transformed discrete-time transfer function algorithm and set the calculated temperature value as the initial temperature value.

Figure 2:
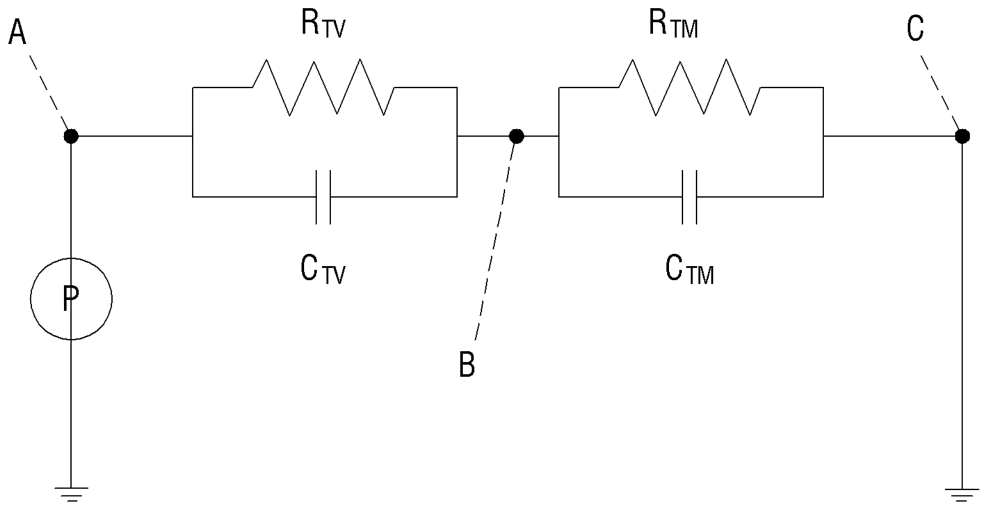
FIG. 2 is a circuit diagram provided to represent heat transfer of an audio output apparatus according to an exemplary embodiment.
Figure 3:
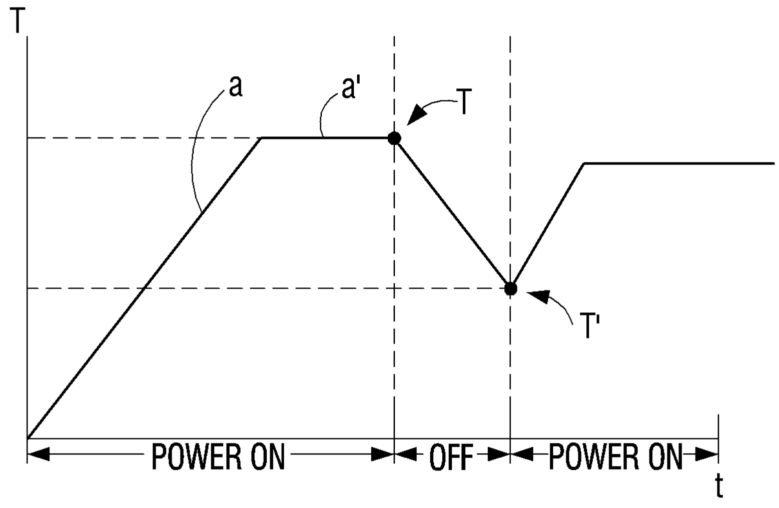
FIG. 3 illustrates temperature change of a voice coil of an audio output apparatus according to an exemplary embodiment.

FIG. 2 is a circuit diagram provided to represent heat transfer of an audio output apparatus according to an exemplary embodiment, and FIG. 3 illustrates temperature change of a voice coil of an audio output apparatus according to an exemplary embodiment.

Referring to FIG. 2, when the audio output apparatus 100 is supplied with power, electric current is introduced into the voice coil, thus possibly generating heat on the voice coil (A). Some of the heat generated at the interval A is transmitted to a permanent magnet (B) based on the heat resistance ($R_{TV}$) and the heat capacity ($C_{TV}$). And some of the heat transmitted to the interval B involved with the permanent magnet may be released to the atmosphere (C) based on the heat resistance ($R_{TV}$) and the heat capacity ($C_{TV}$) of the permanent magnet. However, because larger heat is released from the voice coil (A) than the heat released to the atmosphere (C) for a predetermined time, the temperature of the voice coil (A) can continue rising. The size of the heat released from the voice coil (A) and the heat released to the atmosphere (C) via the permanent magnet (B) may become equal when the temperature of the voice coil (A) have risen above a specific temperature.

That is, referring to FIG. 3, when the initial power is supplied to the audio output apparatus 100, the temperature value of the voice coil rises constantly in the interval a, and maintained constant in the interval a'. That is, because larger heat is released from the voice coil for a predetermined time than the heat released to the atmosphere via the permanent magnet, the temperature value of the voice coil can constantly rise in the interval a. The heat released from the voice coil and the heat released to the atmosphere via the permanent magnet become equal after the interval a, and the temperature of the voice coil is maintained at the calculated temperature value (T) after the interval a.

When the power supply to the audio output apparatus 100 is cut off after the interval a', the temperature of the voice coil may decrease constantly. Accordingly, by the time the power is re-supplied after the cut off, the estimated temperature value (T') of the voice coil at the time of power re-supply may be set to be the initial temperature value of the voice coil.

As explained above, when the initial temperature value of the voice coil is set, the controller 140 may determine a gain value to adjust output level of the audio signal, depending on whether or not the previously-calculated temperature value of the voice coil based on the set initial temperature value resides in the preset threshold interval.

The controller 140 may determine a gain value to adjust the output level of the audio signal based on a first gain value which is lower than a preset reference gain value, when the previously-calculated temperature value of the voice coil exceeds the preset first threshold interval. The 'first threshold interval' may be an interval during which the function of the voice coil can be kept intact.

When the gain value to adjust the output level of the audio signal is determined to be the first gain value which is lower than the reference gain value, based on the first gain value, the controller 140 adjusts the output level to a lower level than the preset output level of the audio signal. Accordingly, the output 130 outputs audio signal with output level lower than the preset output level. As a result, the temperature of the voice coil drops to below the first preset threshold interval.

When the previously-calculated temperature value of the voice coil is in the heat resistant limit, the controller 140 may determine a second gain value, which is lower than the first gain value, to be the gain value for adjusting output level of the audio signal. The heat resistant limit interval may be a temperature interval which exceeds melting point of the voice coil or a temperature interval at which the heat causes damage to the voice coil. The second gain value may be a result of a decrease in proportion to a difference between temperature value of the voice coil in the heat resistant limit interval and the highest temperature value of the first threshold interval.

Generally, the voice coil is coated for the purpose of insulation. Accordingly, when the temperature of the voice coil is maintained within the heat resistant limit interval for a predetermined time period, coating on the voice coil can burn due to overheat and the voice coil can lose function. Accordingly, when the temperature of the voice coil is in the heat resistant limit interval, the controller 140 may determine the second gain value which has a size proportional to the temperature difference between the temperature value of the voice coil in the heat resistant limit interval and the highest temperature value of the first threshold interval, to thus reduce output level of the audio signal. Accordingly, the temperature of the voice coil can be reduced to below the heat resistant limit interval.

As explained above, in a state that the audio signal is output with the output level adjusted based on the first or second gain value, the controller 140 periodically calculates the temperature value of the voice coil and determines whether or not the calculated temperature value of the voice coil is below the preset second threshold interval. The second threshold interval may be an interval in which audio quality is affected when the audio signal is output with low output level.

Accordingly, by determining whether or not the periodically-detected temperature value of the voice coil is below the preset second threshold interval, the controller 140 maintains the preset first or second gain value when the temperature value of the voice coil is between the first and second threshold intervals. When the result of determination indicates that the previously-detected voice coil temperature value is below the second threshold interval, the controller 140 determines the gain value to adjust output level of the audio signal based on a third gain value which is higher than the predetermined first gain value. The third gain value may preferably be varied with narrower interval than that of the first gain value. Accordingly, when the previously-detected voice coil temperature value is below the second threshold interval, the controller 140 determines the third gain value with the narrower interval of variation than that of the first gain value.

When the third gain value is determined, the controller 140 adjusts the output level of the audio signal to be higher than the preset output level, based on the predetermined third gain value. Accordingly, as the output 130 outputs audio signal at a higher output level than was previously output, the temperature of the voice coil can rise to exceed the preset second threshold interval. It is also possible that since the output 130 outputs audio signal with the output level which is adjusted based on the third gain value, which is determined with a narrower variation interval than the first gain value, the temperature of the voice coil can be maintained in the first threshold interval which is stable interval for a long period of time. Additionally, because the audio signal is output with output level adjusted based on the third gain value of narrower variation interval than the first gain value, possible harmful influence on audio quality due to gain variation is minimized.

Figure 4:
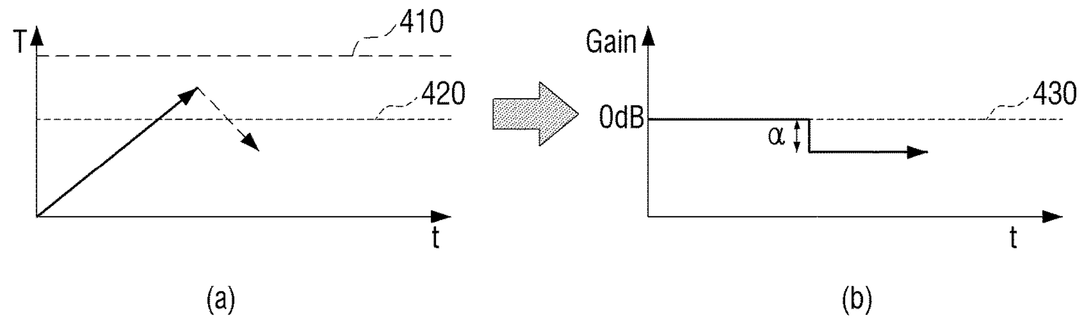
FIG. 4 illustrates an example in which gains are determined according to temperature rise of a voice coil of an audio output apparatus according to an exemplary embodiment.

FIG. 4 illustrates an example in which gains are determined according to temperature rise of a voice coil of an audio output apparatus according to an exemplary embodiment.

Referring to (a) of FIG. 4, when the power is supplied to the audio output apparatus 100 and thus the electric current flows the voice coil, the temperature of the voice coil can rise in proportion to the time during which the electric current flows in. For example, when power is constantly supplied in a state that the temperature of the voice coil at the time point of power supply to the audio output apparatus 100 is at the same degree as the ambient temperature, the voice coil temperature may climb to be higher than the ambient temperature.

That is, the voice coil temperature can rise up to the preset heat resistant limit interval 410, and when the voice coil temperature enters the heat resistant limit interval 410, the heat release rate of the voice coil and the heat emission rate to outside become constant, according to which the temperature of the voice coil can be maintained constantly. Accordingly, the controller 140 constantly monitors on temperature variation of the voice coil and determines whether or not the voice coil temperature exceeds the preset first threshold interval 420. That is, when the power is supplied through the power supply 150, the controller 140 may calculate voice temperature according to a predetermined time unit, using the preset heat transfer model algorithm, and determine whether or not the calculated voice coil temperature exceeds the preset first threshold interval 420.

When the result of determination indicates that the voice coil temperature exceeds the preset first threshold interval 420, the controller 140 determines the gain value to adjust output level of the voice coil based on a second gain value which is lower than the preset reference gain value.

That is, referring to (b) of FIG. 4, the preset reference gain value may be 0 dB. Accordingly, when detecting voice coil temperature at a time point of exceeding the preset first threshold interval 420, the controller 140 may determine the first gain value which is reduced by α from 0 dB. When the first gain value is determined, the controller 140 adjusts the output level of the audio signal to be lower than the preset output level based on the determined first gain value. Accordingly, as the output 130 outputs an audio signal at a lower output level than the preset output level, the voice coil temperature can be reduced to below the preset first threshold interval 420.

When the voice coil temperature drops to below the preset first threshold interval 420, the controller 140 calculates voice coil temperature according to a predetermined time unit, and when determining the calculated voice coil temperature is below the preset first threshold interval 420, the controller 140 may maintain the output level which is adjusted in relation with the predetermined first gain value. As a result, the output 130 can output audio signal at the output level adjusted in relation with the predetermined first gain value.

Figure 5:
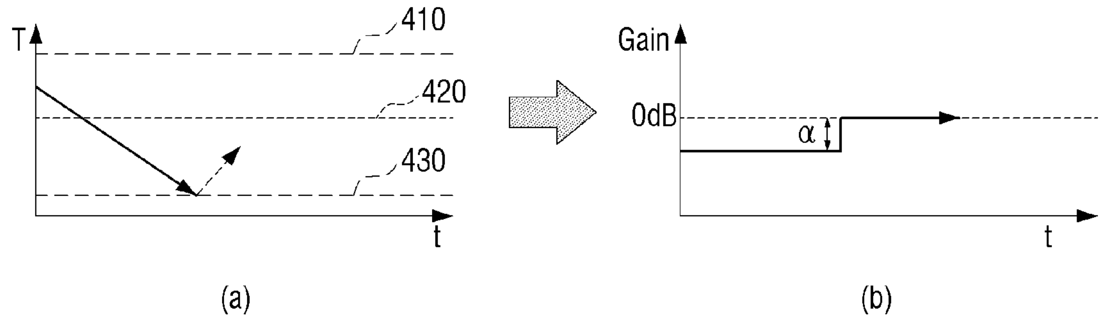
FIG. 5 illustrates an example in which gains are determined according to temperature drop of a voice coil of an audio output apparatus according to an exemplary embodiment.

FIG. 5 illustrates an example in which gains are determined according to temperature drop of a voice coil of an audio output apparatus according to an exemplary embodiment.

Referring to (a) of FIG. 5, when the audio signal is output at an output level down-adjusted in relation with the predetermined first gain value, the voice coil temperature may drop. Accordingly, the controller 140 constantly monitors voice coil temperature variation and determines whether or not the voice coil temperature drops to below the preset second threshold interval which is determined to be the interval in which audio quality is affected or degraded by the voice coil temperature. That is, using the preset heat transfer model algorithm, the controller 140 may calculate voice coil temperature according to a predetermined time unit and determine whether or not the calculated voice coil temperature is below the preset second threshold interval.

When the result of determination indicates that the voice coil temperature is in the preset second threshold interval 430 or lower, the controller 140 determines the gain value to adjust the output level of the audio signal based on a gain value (hereinbelow, 'third gain value) which is higher than the preset first gain value.

That is, referring to (b) of FIG. 5, the controller 140 determines the gain value to adjust the output level of the audio signal based on the first gain value which is increased by α from the preset first reference value. When the first gain value is determined, the controller 140 adjusts output level of the audio signal to a higher level than the preset output level, based on the determined first gain value. As a result, the output 130 outputs the audio signal at a higher level than the preset output level, and the voice coil temperature climbs to be maintained higher than the preset second threshold interval.

Figure 6:
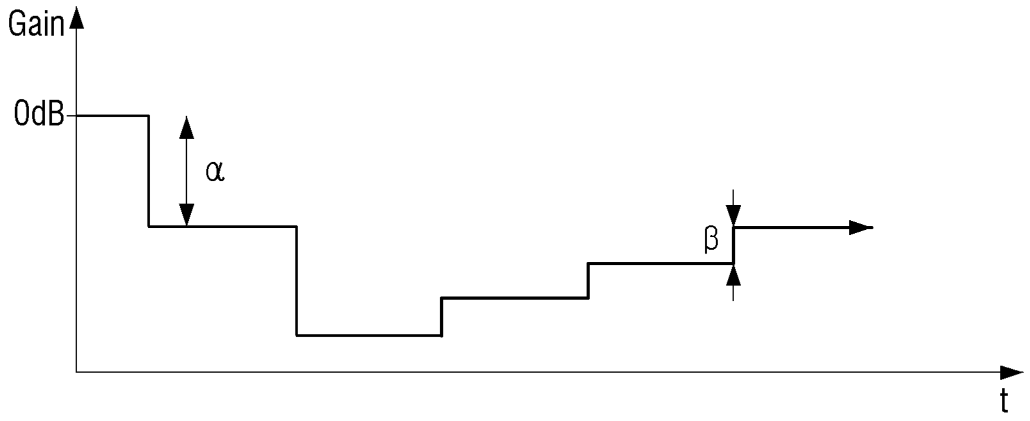
FIG. 6 illustrates gains changed in accordance with temperature change of a voice coil of an audio output apparatus according to an exemplary embodiment.

FIG. 6 illustrates gains changed in accordance with a temperature change of a voice coil of an audio output apparatus according to an exemplary embodiment.

Referring to FIG. 6, when voice coil temperature exceeds the first threshold interval, the gain value may be determined to adjust output level of the audio signal, based on the gain value that is reduced by a from the preset reference gain value. When the voice coil temperature second threshold interval exceeds the first threshold interval during output of the audio signal at the output level adjusted based on the gain value, the gain value may then be determined to adjust output level of the audio signal, based on the gain value that is additionally reduced by a from the preset gain value.

When the voice coil temperature drops to below the first threshold interval during output of the audio signal at the output level adjusted based on the gain value that is additionally reduced by α, the output level may be maintained as adjusted based on the gain value that is additionally reduced by α. When the adjusted output level based on the gain value that is additionally reduced by α is maintained, so that the voice coil temperature is dropped to the second threshold interval during output of the audio signal, the gain value may be determined to adjust output level of the audio signal based on a gain value that is increased by β. The variation interval of β may preferably be narrower than that of α. For example, when the voice coil temperature is dropped to below the first threshold interval, the gain value to adjust the output level of the audio signal can be the one that is reduced by −0.5 dB from the preset reference gain value (i.e., 0 dB). Then when the voice coil temperature is increased to above the second threshold interval, the gain value to adjust the output level of the audio signal can be the one that is increased by +0.25 dB from the preset reference gain value (i.e., 0 dB).

Accordingly, it is possible to not only minimize variation of the gains, but also constantly maintain the voice coil temperature in the first threshold interval which is the stable voice coil temperature interval, by differently adjusting the interval of decreasing and increasing the gain value to adjust the output level of the audio signal according to the variation of voice coil temperature.

Figure 7:
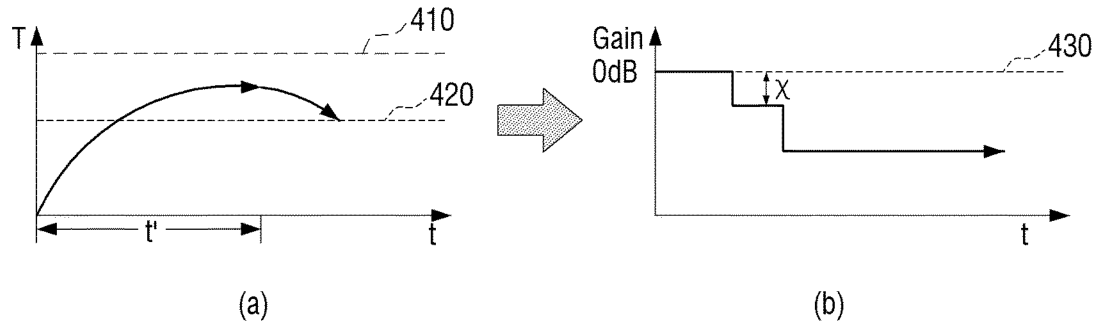
FIG. 7 illustrates a first example in which gains are determined according to temperature rise of a voice coil of an audio output apparatus according to an exemplary embodiment.
Figure 8:
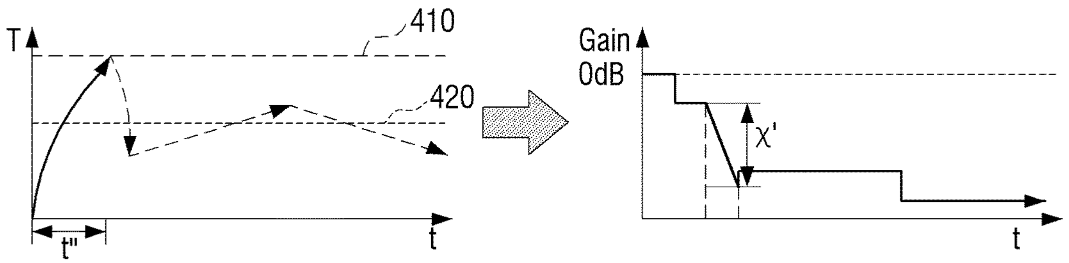
FIG. 8 illustrates a second example in which gains are determined according to temperature rise of a voice coil of an audio output apparatus according to another exemplary embodiment.

FIG. 7 illustrates a first example in which gains are determined according to temperature rise of a voice coil of an audio output apparatus according to an exemplary embodiment, and FIG. 8 illustrates a second example in which gains are determined according to temperature rise of a voice coil of an audio output apparatus according to another exemplary embodiment.

Referring to (a) of FIG. 7, when the voice coil temperature is gradually increased for time t' and in between the heat resistant limit interval 410 and the first threshold interval 420, the gain value to adjust output level of the audio signal can be decreased in a stepwise manner. That is, when the voice coil temperature is gradually increased for time t' and in between the heat resistant limit interval 410 and the first threshold interval 420, referring to (b) of FIG. 7, the gain value to adjust output level of the audio signal may be determined to be the one that is decreased from the reference gain value (0 dB) by x in a stepwise manner.

When the gain value to adjust output level of the audio signal decreases in a stepwise manner, it is possible to adjust the output level of the audio signal in a stepwise manner based on the gain values that are stepwise-reduced. Further, since the audio signal is output at a stepwise-adjusted output level, the voice coil temperature is decreased gradually.

Referring to (a) FIG. 8, when the voice coil temperature rapidly increases within time t" which is shorter than time t' of (a) of FIG. 7 and reaches close to the heat resistant limit interval 410, the gain value to adjust output level of audio signal can rapidly decrease.

That is, when the voice coil temperature rapidly increases within time t" which is shorter than time t' and reaches close to the heat resistant limit interval 410, referring to (b) FIG. 8, the gain value to adjust output level of audio signal may be determined to be the one that is reduced by x' from the reference gain value (i.e., 0 dB). That size of x' may be proportional to the difference between the voice coil temperature in the heat resistant interval 410 and the highest temperature value of the preset first threshold interval 420.

Accordingly, when the voice coil temperature rapidly climbs to the heat resistant limit interval 410, based on the gain value that is reduced by the size x' from the reference gain value of 0 dB, the output level of the audio signal is adjusted. As a result, the voice coil temperature can be rapidly decreased to below the heat resistant limit interval 410.

The respective constitutions of the audio output apparatus 100 to adjust voice coil temperature by adjusting gain value to adjust output level of audio signal based on the variation in voice coil temperature have been explained in detail. Hereinbelow, a method for outputting audio by the audio output apparatus 100 according to an exemplary embodiment will be explained.

Figure 9:
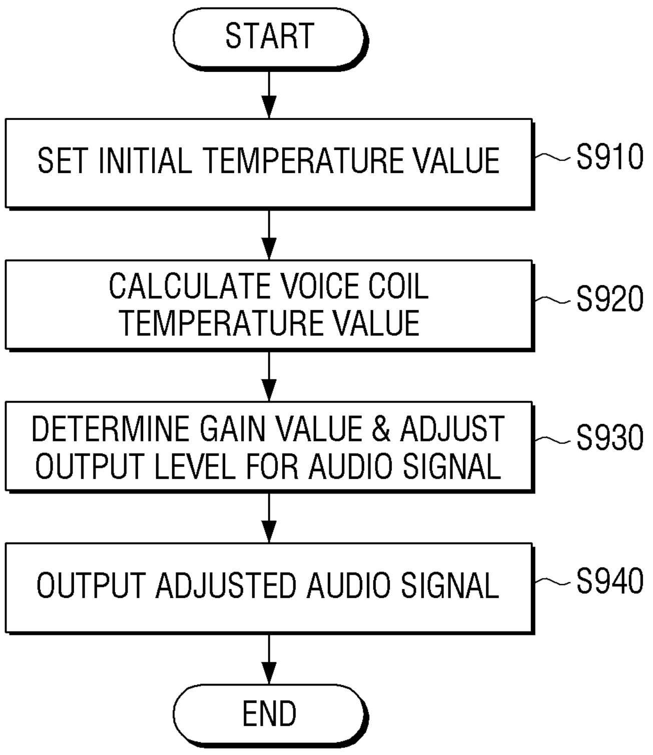
FIG. 9 is a flowchart provided to explain an audio output method of an audio output apparatus according to an exemplary embodiment.

FIG. 9 is a flowchart provided to explain an audio output method of an audio output apparatus according to an exemplary embodiment.

Referring to FIG. 9, at Operation S910, the audio output apparatus 100 sets initial temperature value of the voice coil using preset heat transfer model algorithm. The initial temperature value may be a temperature of the voice coil at a time point when power is re-supplied to the audio output apparatus 100 after the initial power supply to the audio output apparatus 100 is cut off. The heat transfer model algorithm is the same one that is used to calculate voice coil temperature, and will not be explained in greater detail below, but referenced to the explanation provided above.

When initial power is supplied to audio output apparatus 100, the voice coil temperature is calculated using the heat transfer model algorithm. When the power supply is cut off, the audio output apparatus 100 may calculate the voice coil temperature that corresponds to a time point of power cut off based on the heat transfer model algorithm expressed by Mathematical Expression 1, and set an initial temperature value based on the voice coil temperature value that is calculated at the time point of power re-supply.

Accordingly, at Operation S920, when external power is supplied in a state that the initial voice coil temperature is set, the audio output apparatus 100 calculates the voice coil temperature using the heat transfer model algorithm described above. At Operation S930, the audio output apparatus 100 determines gain value to adjust output level of the audio signal according to the calculated voice coil temperature and adjusts output level of the audio signal based on the determined gain value. To be specific, the audio output apparatus 100 may determine the gain value to adjust output level of the audio signal depending on whether or not the voice coil temperature calculated based on the preset initial temperature value is in the preset threshold interval, and adjust the output level of the audio signal based on such gain value.

When the output level of the audio signal is adjusted, at Operation S940, the audio output apparatus 100 outputs audio signal based on the adjusted output level. Accordingly, the audio output apparatus 100 according to an exemplary embodiment can determine gain value to adjust output level of the audio signal according to internal temperature variation of the voice coil as heated by the inflow of electric current to the voice coil and maintain the voice coil at a predetermined temperature.

Hereinbelow, a method of the audio output apparatus 100 for determining gain value to adjust output level of the audio signal according to voice coil temperature variation according to an exemplary embodiment will be explained.

Figure 10:
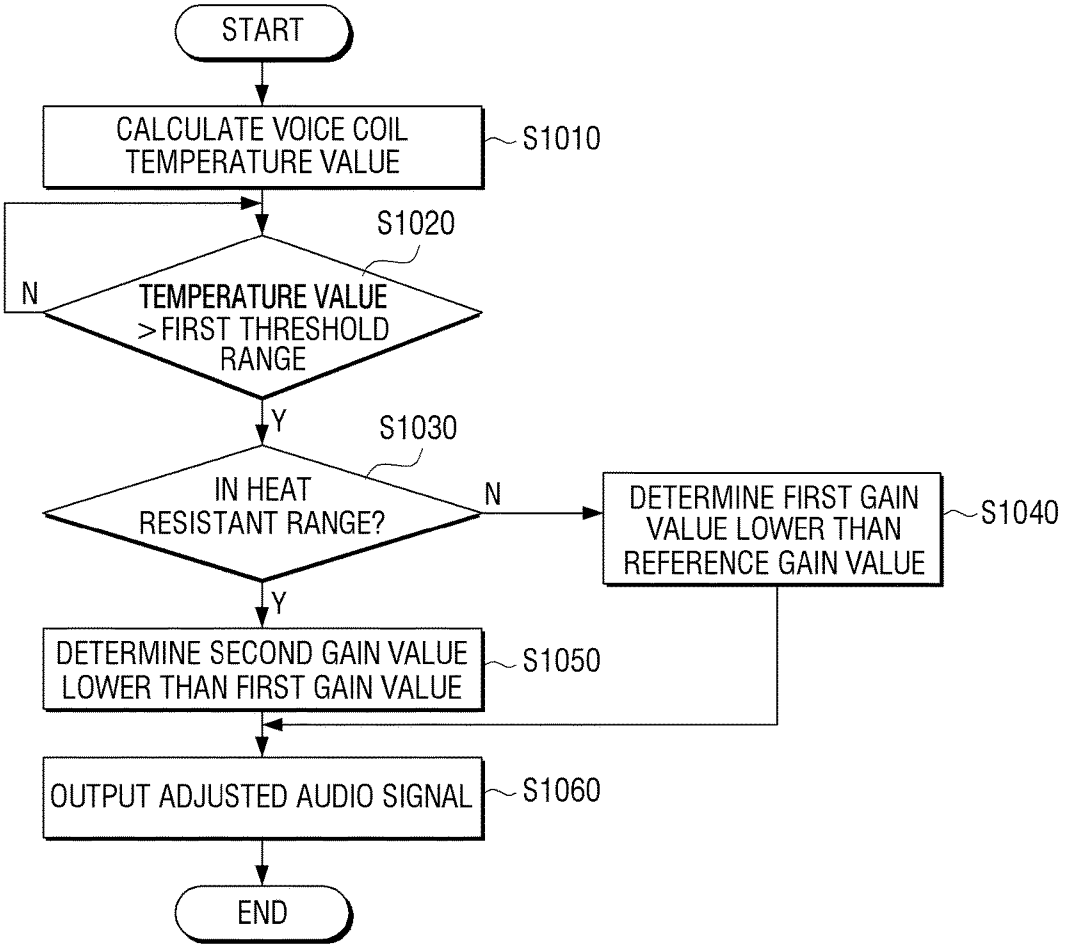
FIG. 10 is a flowchart provided to explain a method for determining gains according to temperature rise of a voice coil of an audio output apparatus according to an exemplary embodiment.

FIG. 10 is a flowchart provided to explain a method for determining gains according to temperature rise of a voice coil of an audio output apparatus according to an exemplary embodiment.

Referring to FIG. 10, at Operation S1010, the audio output apparatus 100 periodically calculates voice coil temperature using the heat transfer model algorithm. When calculating voice coil temperature, at Operation S1020, the audio output apparatus 100 determines whether or not the calculated voice coil temperature exceeds a preset first threshold interval. The first threshold interval may be an interval in which the voice coil function is kept intact.

When the result of determination indicates that the voice coil temperature does not exceed the preset first threshold interval, the audio output apparatus 100 may output audio signal at a preset output level. When the result of determination indicates that the voice coil temperature exceeds the preset first threshold interval, at Operation S1030, the audio output apparatus 100 determines whether or not the voice coil temperature is in the heat resistant limit interval. The heat resistant limit interval may be a temperature interval above a melting point of the voice coil.

When the result of determination indicates that the voice coil temperature is in the heat resistant limit interval, at Operation S1040, the audio output apparatus 100 determines a gain value to adjust output level of the audio signal based on the first gain value that is lower than the preset reference gain value. That is, when the voice coil temperature is between the first threshold interval and the heat resistant limit interval, the audio output apparatus 100 may determine the gain value to adjust output level of the audio signal based on the first gain value that is lower than the preset reference gain value.

At Operation S1050, when it is determined at Operation S1030 that the voice coil temperature is in the heat resistant limit interval, the audio output apparatus 100 determines the gain value to adjust output level of the audio signal based on a second gain value that is lower than the first gain value determined at Operation S1040. Accordingly, when the gain value to adjust output level of the audio signal is determined to be first or second gain value in Operation S1040 or Operation S1050, at Operation S1060, the audio output apparatus 100 adjusts output level of the audio signal based on the first or second output level and output the audio signal to the adjusted audio output level.

Accordingly, when the voice coil is in the first threshold interval or in the heat resistant limit interval, the audio output apparatus 100 can adjust the output level of the audio signal to be lower than the preset output level, by determining the gain value to adjust output level of the audio signal to a lower gain value (i.e., first or second gain value). As a result, as the audio output apparatus 100 outputs audio signal at an output level adjusted based on the first or second gain value, the voice coil temperature is dropped to below the first temperature interval or heat resistant limit interval.

Figure 11:
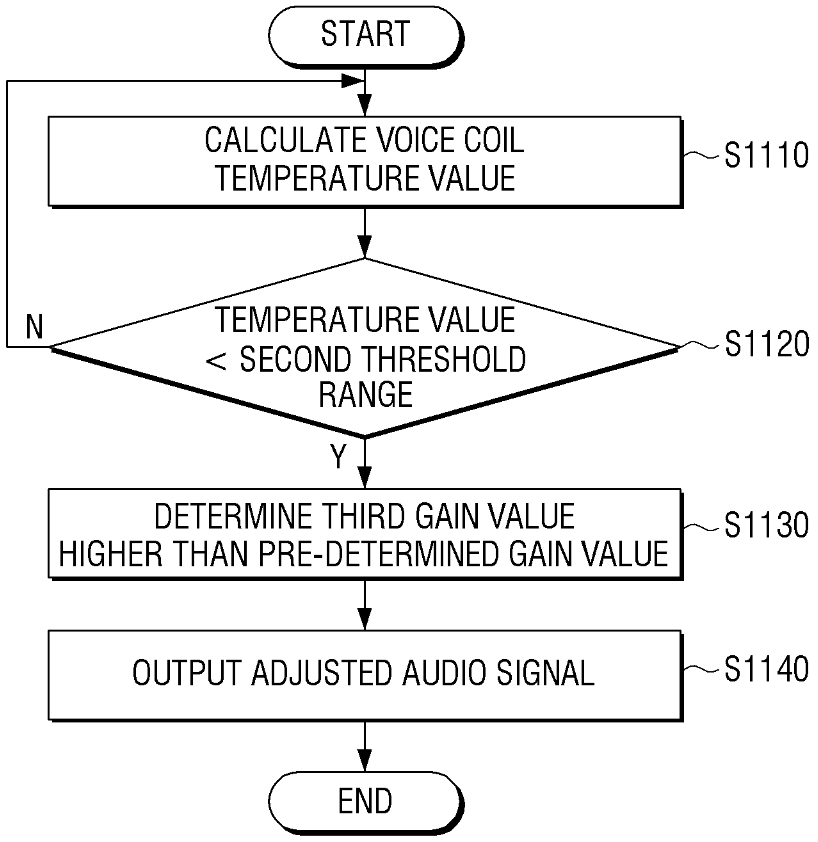
FIG. 11 is a flowchart provided to explain a method for determining gains according to temperature drop of a voice coil of an audio output apparatus according to an exemplary embodiment.

FIG. 11 is a flowchart provided to explain a method for determining gains according to temperature drop of a voice coil of an audio output apparatus according to an exemplary embodiment.

Referring to FIG. 11, the voice coil temperature can be gradually decreased when the audio output apparatus 100 adjusts output level of the audio signal based on the gain value determined as explained above with reference to FIG. 10. Accordingly, at Operation S1110, the audio output apparatus 100 periodically calculates voice coil temperature using the heat transfer model algorithm explained above, in a state that the audio signal is output at an output level that is adjusted based on the predetermined gain value. After that, at Operation S1120, the audio output apparatus 100 determines whether or not the calculated voice coil temperature drops to below the preset second threshold interval. The second threshold interval may be an interval in which the audio quality is degraded or affected during audio signal output at a lower output level.

When the result of determination indicates that the voice coil temperature is higher than the preset second threshold interval, the audio output apparatus 100 maintains the predetermined gain value. That is, when the voice coil temperature is between the first and second threshold intervals, the audio output apparatus 100 maintains the predetermined gain value. When the result of determination indicates that the voice coil temperature is lower than the second threshold interval, at Operation S1130, the audio output apparatus 100 determines a third gain value that is higher than the predetermined gain value.

The third gain value may be varied with a narrower variation interval than that of the preset gain value. For example, the predetermined gain value may be reduced by −0.5 dB from the preset reference gain value of 0 dB. The third gain value may be a gain value that is increased by +0.25 dB from the predetermined gain value.

At Operation S1140, the audio output apparatus 100 adjusts output level of the audio signal based on the third gain value and outputs audio signal at the adjusted output level. Accordingly, the audio output apparatus 100 outputs audio signal at a higher level than previously, and the voice coil temperature rises possibly above the preset second threshold interval. As explained above, by differently adjusting the interval of increasing and decreasing gain value to adjust output level of the audio signal in accordance with temperature variation of the voice coil, it is possible to minimize the gain variation, and also constantly maintain the voice coil temperature in the first threshold interval which is stable interval.

The foregoing exemplary embodiments and advantages are merely exemplary and are not to be construed as limiting the inventive concept. The present teaching can be readily applied to other types of apparatuses. Also, the description of the exemplary embodiments of the present inventive concept is intended to be illustrative, not to limit the scope of the claims, and many alternatives, modifications, and variations will be apparent to those skilled in the art.

What is claimed is:

1. A method of outputting audio, the method comprising:

calculating a temperature value of a voice coil of an audio output apparatus using a heat transfer model algorithm, in response to power being supplied to the voice coil;

calculating a temperature value of the voice coil using an algorithm transformed from the heat transfer model algorithm in response to power being re-supplied to the voice coil and setting the temperature value of the voice coil calculated using the transformed algorithm to be an initial temperature of the voice coil;

adjusting an output level of an audio signal by determining a gain value to adjust the output level of the audio signal depending on whether or not a temperature value of the voice coil calculated based on the set initial temperature value is within a threshold interval; and outputting the audio signal with the adjusted output level.

2. The method of claim 1, wherein the initial temperature value of the voice coil is a temperature value of the voice coil at a time point of power being re-supplied to the voice coil of the audio output apparatus after a cut off of an initial power supply.

3. The method of claim 1, wherein the heat transfer model algorithm is expressed by:

$$T(s)/P(s)=(R_{TV}R_{TM}(C_{TV}+C_{TM})s+(R_{TV}+R_{TM}))/((R_{TV}R_{TM}C_{TV}C_{TM})s^2+(R_{TV}C_{TV}+R_{TM}C_{TM})s+1),$$

where P(s) denotes output power relative to the audio signal, T(s) is temperature value of the voice coil, $R_{TV}$ is heat resistance of the voice coil, $C_{TV}$ is heat capacity of the voice coil, $R_{TM}$ is heat resistance of a permanent magnet, and $C_{TM}$ is heat capacity of the permanent magnet.

4. The method of claim 1, wherein the adjusting comprises:

determining whether the temperature value of the voice coil calculated based on the initial temperature value is in a first threshold interval; and in response to determining that the temperature value of the voice coil calculated using the initial temperature value exceeds the first threshold interval, determining the gain value to adjust the output level of the audio signal based on a first gain value that is lower than a reference gain value.

5. The method of claim 4, wherein the adjusting further comprises, in response to the temperature value of the voice coil calculated using the initial temperature value being in a heat resistant limit interval, determining the gain value to adjust the output level of the audio signal based on a second gain value that is lower than the first gain value.

6. The method of claim 5, wherein the heat resistant limit interval is a temperature interval exceeding a melting point of the voice coil, and the second gain value is in proportion to a difference between the temperature value of the voice coil calculated using the initial temperature value and a highest temperature value of the first threshold interval.

7. The method of claim 5, wherein the calculating comprises measuring the temperature of the voice coil continuously at a predetermined interval, and wherein the adjusting further comprises:

determining whether the temperature value of the voice coil calculated using the initial temperature value is below a second threshold interval, in a state that the audio signal is output at an output level adjusted based on the first or second gain value; and in response to determining that the temperature value of the voice coil calculated using the initial temperature value is between the first and second threshold intervals, maintaining the first or second gain value, or in response to determining that the temperature value of the voice coil calculated using the initial temperature value is below the second threshold interval, determining the gain value to adjust the output level of the audio signal based on a third gain value that is higher than the first gain value.

8. The method of claim 7, wherein the third gain value is within a narrower interval than that of the first gain value.

9. An audio output apparatus comprising:

an input configured to receive an audio signal;

a signal processor configured to process the audio signal;

an output configured to output the processed audio signal;

a controller configured to calculate a temperature value of a voice coil of an audio output apparatus using a heat transfer model algorithm, in response to power being supplied to the voice coil, calculate a temperature value of the voice coil using an algorithm transformed from the heat transfer model algorithm temperature value, in response to power being re-supplied to the voice coil, set the temperature value of the voice coil calculated using the transformed algorithm to be an initial temperature of the voice coil, and determine a gain value to adjust an output level of the audio signal depending on whether or not a temperature value of the voice coil calculated based on the set in temperature value is within a threshold value, and adjust the output level of the processed audio signal.

10. The audio output apparatus of claim 9, wherein the initial temperature value of the voice coil is a temperature value of the voice coil at a time point of power being re-supplied to the voice coil of the audio output apparatus after a cut off of an initial power supply.

11. The audio output apparatus of claim 9, wherein the heat transfer model algorithm is expressed by:

$$T(s)/P(s)=(R_{TV}R_{TM}(C_{TV}+C_{TM})s+(R_{TV}+R_{TM}))/((R_{TV}R_{TM}C_{TV}C_{TM})s^2+(R_{TV}C_{TV}+R_{TM}C_{TM})s+1),$$

where P(s) denotes output power relative to the audio signal, T(s) is temperature value of the voice coil, $R_{TV}$ is heat resistance of the voice coil, $C_{TV}$ is heat capacity of the voice coil, $R_{TM}$ is heat resistance of a permanent magnet, and $C_{TM}$ is heat capacity of the permanent magnet.

12. The audio output apparatus of claim 9, wherein, in response to the temperature value of the voice coil calculated using the initial temperature value exceeding a first threshold interval, the controller determines the gain value to adjust the output level of the audio signal based on a first gain value that is lower than a reference gain value.

13. The audio output apparatus of claim 12, wherein, in response to the temperature value of the voice coil calculated using the initial temperature value being in a heat resistant limit interval, the controller determines the gain value to adjust the output level of the audio signal based on a second gain value that is lower than the first gain value.

14. The audio output apparatus of claim 13, wherein the heat resistant limit interval is a temperature interval exceeding a melting point of the voice coil, and the second gain value is in proportion to a difference between the temperature value of the voice coil calculated using the initial temperature value and a highest temperature value of the first threshold interval.

15. The audio output apparatus of claim 13, wherein the controller determines whether the temperature value of the voice coil calculated using the initial temperature value is below a second threshold interval, in a state that the audio signal is output at an output level adjusted based on the first or second gain value, and maintains the first or second gain value in response to the temperature value of the voice coil calculated using the initial temperature value being between the first and second threshold intervals, or determines the gain value to adjust the output level of the audio signal based on a third gain value that is higher than the first gain value in response to determining that the temperature value of the voice coil calculated using the initial temperature value is below the second threshold interval.

16. The audio output apparatus of claim 15, wherein the third gain value is within a narrower interval than that of the first gain value.

17. A method for outputting audio, the method comprising:

calculating a temperature value of a voice coil of an audio output apparatus using a heat transfer model algorithm, in response to power being supplied to the voice coil;

calculating a temperature value of the voice coil using an algorithm transformed from the heat transfer model algorithm in response to power being re-supplied to the voice coil and setting the temperature value of the voice coil calculated using the transformed algorithm to be an initial temperature of the voice coil;

adjusting an audio signal by using a gain value determined depending on whether or not a temperature value of the voice coil based on the set initial temperature value is within a threshold value; and outputting the adjusted audio signal.

18. The method of claim 17, wherein the heat transfer model algorithm is expressed by:

$$T(s)/P(s)=(R_{TV}R_{TM}(C_{TV}+C_{TM})s+(R_{TV}+R_{TM}))/((R_{TV}R_{TM}C_{TV}C_{TM})s^2+(R_{TV}C_{TV}+R_{TM}C_{TM})s+1),$$

where P(s) denotes output power relative to the audio signal, T(s) is temperature value of the voice coil, $R_{TV}$ is heat resistance of the voice coil, $C_{TV}$ is heat capacity of the voice coil, $R_{TM}$ is heat resistance of a permanent magnet, and $C_{TM}$ is heat capacity of the permanent magnet.

* * * * *